United States Patent [19]

Fusco

[11] Patent Number: 4,950,554

[45] Date of Patent: Aug. 21, 1990

[54] COMPOSITE COPPER-MOLYBDENUM SHEET

[75] Inventor: Ronald S. Fusco, Mentor, Ohio

[73] Assignee: AMAX Inc., New York, N.Y.

[21] Appl. No.: 357,837

[22] Filed: May 30, 1989

[51] Int. Cl.$^5$ .............................................. B32B 15/01
[52] U.S. Cl. .................................................. 428/663
[58] Field of Search .......................................... 428/663

[56] References Cited

U.S. PATENT DOCUMENTS 2,966,738  1/1961  Bertossa ................................ 428/663
4,025,997  5/1977  Gernitis et al. ....................... 428/663

Primary Examiner—Theodore Morris
Assistant Examiner—David Schumaker
Attorney, Agent, or Firm—Michael A. Ciomek; Eugene J. Kalil

[57] ABSTRACT

Directed to the production of composite copper-molybdenum sheet by assembling at least one plate of molybdenum with at least one plate of copper to form a composite billet, heating the billet in a protective atmosphere to a temperature within the hot working range for copper, working the billet in a protective atmosphere to effect a reduction in thickness of at least about 40% to bond said copper and said molybdenum together and thereafter further working the resulting bonded billet.

5 Claims, 1 Drawing Sheet

20% Cu-Mo-Cu   50X

COMPOSITE COPPER-MOLYBDENUM SHEET

The invention is directed to composite materials in sheet form wherein copper and molybdenum are bonded together in layers.

BACKGROUND OF THE INVENTION

It has long been known that unique combinations of properties can be obtained in many articles by producing such articles as composite materials, so as to utilize desirable properties contributed by dissimilar materials incorporated in the composite structure. Examples which quickly come to mind include glass-fiber reinforced plastic articles widely used in marine and aviation applications such as boats, carbon fiber reinforced articles such as golf club shafts and many other articles, composite copper-cored coins such as the United States dime, quarter, etc. It has been recognized that special combinations of properties can be provided by the composite rout which are not possible in a single material.

Inevitably, the demand for highly specialized combinations of properties in materials becomes more acute as the requirements imposed by increased sophistication in industry become more severe. For example, the electronics industry has been subject to increased demands for materials as miniaturization of equipment coupled with higher power and the generation of more heat in smaller packages has proceeded.

It is recognized that copper is a metal characterized by high conductivity for heat and electricity which suffers drawbacks in terms of desired strength for many applications. Copper is relatively soft and malleable and is readily workable. Molybdenum is a metal characterized by high melting point, 2610° C., whereas copper melts at 1083° C. Molybdenum is strong and retains its strength at elevated temperatures, e.g., 1000° C. Copper and molybdenum are essentially immiscible at any temperature. Forging temperatures for molybdenum are said to be generally between 1180° and 1290° C., a temperature range exceeding the melting point of copper. The expansivity coefficient (T.C.E.) for copper is much higher than that for molybdenum.

A review of the differences in properties and characteristics between molybdenum and copper would lead one skilled in the art to believe that molybdenum and copper could not be combined in a composite structure due to the great disparity in properties between the two metals. Such a composite has heretofore been unknown.

The present invention is based on the discovery of a method for producing a composite sheet of copper and molybdenum.

BRIEF STATEMENT OF THE INVENTION

The invention contemplates producing composite molybdenumcopper sheet by assembling at least one plate of molybdenum with at least one plate of copper to form a composite billet, heating the resulting composite billet in a protective atmosphere to a temperature within the hot working temperature range for copper, working said billet in a protective atmosphere to effect a reduction in thickness thereof of at least about 40% to bond said copper and said molybdenum together and thereafter further reducing the thickness of the bonded billet by hot and/or cold working to produce composite sheets of sandwich configuration with either copper or molybdenum in the center.

In the drawing

DETAILED DESCRIPTION OF THE INVENTION

Figure 1:
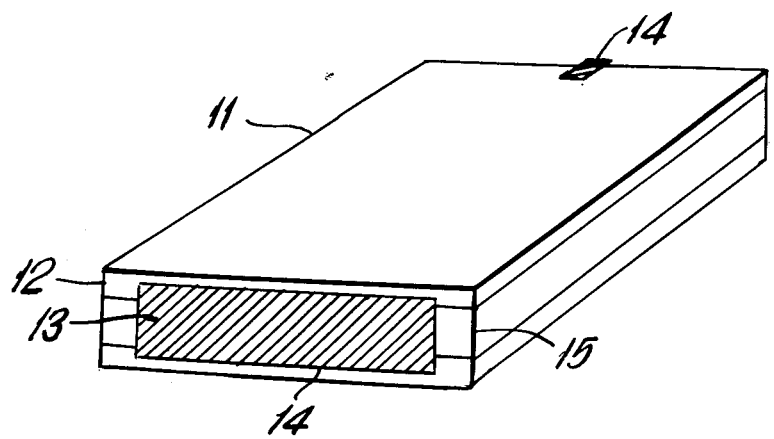
FIG. 1 depicts a form of composite billet in accordance with the invention.

The invention will be described in conjunction with the drawing wherein FIG. 1 depicts a composite billet 11 having outer layers 12 of molybdenum and a core 13 of copper. In preparing the billet the surfaces of the molybdenum and copper elements are cut to size and carefully cleaned as by pickling, grinding, etc. The plate elements of copper and molybdenum are then welded together as by clips 14 which may be made of copper. Supplemental filler strips 15 may be made of molybdenum. The assembled billet is heated in a protective atmosphere essentially devoid of oxygen at a temperature within the hot working range for copper, e.g., about 700° to about 1000° C., preferably about 850° to about 900° C. for a time sufficient to through heat the billet and the hot billet is passed through flat rolls, again in a protective atmosphere, to effect a reduction in thickness of about 35% to about 45%, e.g., 40%. Usually bonding is effected in one or two passes. Initial bonding can also be accomplished by brazing. The bonding temperature should be not less than 700° C., because, at lower temperatures the differences in hot working characteristics of copper and molybdenum become too great and should not exceed about 1000° C., to avoid melting the copper. The protective atmosphere for heating the billet is essentially devoid of oxygen and may be argon, helium, nitrogen, hydrogen, a vacuum, etc. The protective atmosphere employed during hot working may be nitrogen. It is to be borne in mind that molybdenum is a readily oxidizable metal and that some oxides of molybdenum are volatile.

The thickness ratio of molybdenum to copper in the composite may be in the range 10% to 90% copper to 10% to 90% molybdenum and is established during the bonding step. The thickness ratio does not change materially during subsequent hot or cold reduction to reach the desired thickness.

An example will now be given.

A sandwich type flat billet 15"×25"×0.438" was prepared by assembling two copper plates 0.125" thick with a molybdenum plate 0.188" thick sandwiched therebetween. The billet was fastened together with one ⅛"×0.438"×25" copper plate welded to the head end of the billet and with a single copper strap ⅛"×1"×3" folded over and welded in place over the tail end.

Before assembly, each molybdenum plate was given a caustic and then an acid clean and was pickled in nitric-sulfuric acid. The copper plate was given a dip in nitric-hydrofluoric acid solution for cleaning. The assembled billet was heated in hydrogen for 20 minutes in a 900° C. furnace and reduced in successive passes through flat rolls to 0.265" thick, 0.180" thick then to 0.1150/0.120" thick. Bonding essentially was established in the first pass at a reduction of about 39%. The plate was hot sheared to remove ends and edges and a composite plate 24"×50" was recovered which had a copper cladding of about 25% on a molybdenum core. About 80% of the weight of the initial billet was recovered as useful product. The hot rolled bonded plate was given an acid clean and was then cold rolled to 0.045" thick.

Figure 2:
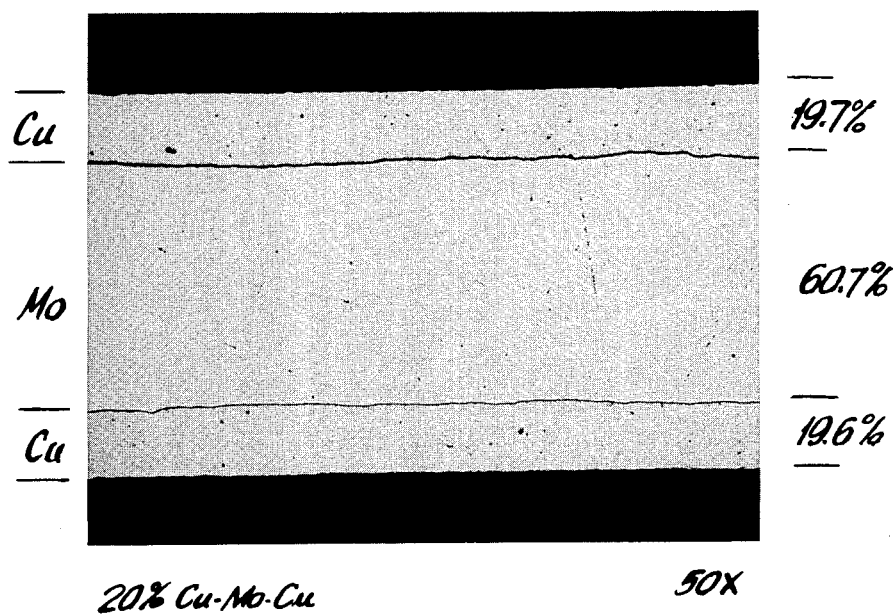
FIG. 2 is a photomicrograph taken at a magnification of 50 diameters showing the bond area between copper and molybdenum as produced in accordance with the invention.

FIG. 2 depicts the microstructure of the bond area in the cold rolled sheet thus produced. The interface between molybdenum and copper is sharply defined. The interface resists cleavage therealong despite the fact that there is no material solubility of one metal in the other. No diffusion is detected between the two metals across the interface.

The following table sets forth combinations of properties provided in Cu-Mo composite sheet of the invention as a function of copper content.

| % Cu side | T.C.E. (ppm °C.) | Density (lb/in$^3$) | Modulus (lbs/in$^2$ × 10$^{-6}$) | Conductivity (Watts/cm °C.) Directions | |
|---|---|---|---|---|---|
| | | | | x,y | z |
| 5 | 5.4 | 0.36 | 41 | 166 | 152 |
| 13 | 5.8 | 0.36 | 39 | 210 | 173 |
| 20 | 6.8 | 0.35 | 37 | 244 | 197 |
| 25 | 7.8 | 0.35 | 33 | 260 | 215 |
| 33⅓ | 8.8 | 0.34 | 28 | 305 | 249 |

While the invention has been illustrated in terms of copper clad molybdenum sheet, composite sheet consisting of copper having a molybdenum cladding on one or both faces can also be produced in the same fashion.

Further, while the invention has been illustrated in terms of high pressure roll bonding, the initial composite may be bonded using explosive forming techniques. Hot pressing, e.g., hot isostatic pressing or brazing may also be employed for bonding.

Cold rolling of the composite may be accomplished using conventional techniques.

The composite material is useful in high performance electronics applications (1st and 2nd level) where controlled T.C.E. and heat dissipation are of critical importance. Desired T.C.E. can be provided by controlling the copper content. The material can also withstand multiple high temperature firings to temperatures up to 900° C., as may be required, for example, in applying a glass, or alumina ceramic or metal ceramic insulating coating which will usually have a T.C.E. of about 5.4 to about 6.7 in./in./°C; while still maintaining structural integrity. The material can readily be formed into containers, such as boxes and the like, using conventional metal forming techniques. The stiffness and rigidity of the composite contributes to the production of flat surfaces in the articles formed.

We claim:

1. A roll-bonded composite sheet product having at least one layer of copper and at least one layer of molybdenum, said product having been subjected to at least one hot working operation at a temperature in the hot working temperature range for copper and having a sharply defined cleavage-resistant interfacial zone between molybdenum and copper with no detectable diffusion between the two metals across said interface, said composite being resistant to the deleterious effects of multiple high temperature firings at temperatures up to 900° C.

2. A composite sheet product in accordance with claim 1 having a core layer of molybdenum and facing layers of copper.

3. A composite sheet product in accordance with claim 1 having a core layer of copper and facing layers of molybdenum.

4. A composite sheet product in accordance with claim 1 having a copper thickness of about 10% to about 90% of the total thickness of the composite sheet.

5. A package for holding electronic components made from a roll-bonded composite copper-molybdenum sheet having a copper thickness of about 10% of about 90% of the total thickness of the composite sheet and having a combination of properties including Thermal Coefficient of Expansion, strength, density, conductivity and modulus controlled by controlling the copper thickness, said roll-bonded composite copper-molybdenum sheet product having at least one layer of copper and at least one layer of molybdenum, said product having been subjected to at least one hot working operation at a temperature in the hot working temperature range for copper and having a sharply defined cleavage-resistant interfacial zone between molybdenum and copper with no detectable diffusion between the two metals across said interface, said composite being resistant to the deleterious effects of multiple high temperature firings at temperatures up to 90° C.

* * * * *